United States Patent
Yang et al.

(10) Patent No.: US 6,737,359 B1
(45) Date of Patent: May 18, 2004

(54) METHOD OF FORMING A SHALLOW TRENCH ISOLATION USING A SION ANTI-REFLECTIVE COATING WHICH ELIMINATES WATER SPOT DEFECTS

(75) Inventors: Shu-Yuan Yang, Taoyuan (TW); Chaucer Chung, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 414 days.

(21) Appl. No.: 09/460,112

(22) Filed: Dec. 13, 1999

(51) Int. Cl.$^7$ ................................................ H01L 21/70
(52) U.S. Cl. ................ 438/745; 438/710; 438/700; 438/724; 438/744; 438/749; 438/757
(58) Field of Search ................ 438/700, 710, 438/724, 744–747

(56) References Cited

U.S. PATENT DOCUMENTS

| | | | |
|---|---|---|---|
| 3,657,030 A | * 4/1972 | Porter | 156/13 |
| 5,459,096 A | 10/1995 | Venkatesan et al. | 437/67 |
| 5,679,599 A | 10/1997 | Mehta | 437/69 |
| 5,721,174 A | 2/1998 | Peidous | 438/445 |
| 5,786,263 A | * 7/1998 | Perera | 438/431 |
| 5,949,126 A | * 9/1999 | Dawson et al. | 257/513 |
| 6,001,704 A | * 12/1999 | Cheng et al. | 438/410 |
| 6,020,230 A | * 2/2000 | Wu | 438/222 |
| 6,051,510 A | * 4/2000 | Fulford, Jr. et al. | 438/778 |
| 6,087,236 A | * 7/2000 | Chau et al. | 438/301 |

* cited by examiner

Primary Examiner—Robert Kunemund
(74) Attorney, Agent, or Firm—George O. Saile; Stephen B. Ackerman

(57) ABSTRACT

A method for forming a shallow trench isolation using a SiON anti-reflective coating which eliminates water spot defects. The method begins by providing a substrate. A pad oxide layer is formed over the substrate. A silicon nitride layer is formed on the pad oxide layer. A silicon oxynitride layer is formed on the silicon nitride layer. A photoresist mask, having an opening, is formed over the silicon oxynitride layer. The silicon oxynitride layer, the silicon nitride layer, the pad oxide layer, and the substrate are etched through the opening, forming a trench. The photoresist mask is removed. In the key step, the silicon oxynitride layer is removed. Then, a thin silicon oxide layer is grown and a silicon oxide layer is deposited and planarized to form a shallow trench isolation.

14 Claims, 2 Drawing Sheets

METHOD OF FORMING A SHALLOW TRENCH ISOLATION USING A SION ANTI-REFLECTIVE COATING WHICH ELIMINATES WATER SPOT DEFECTS

BACKGROUND OF INVENTION

1) Field of the Invention

This invention relates generally to fabrication of a semiconductor device and more particularly to a method of forming a shallow trench isolation using a silicon oxynitride anti-reflective coating which does not suffer from water spot defects.

2) Description of the Prior Art

In order to improve the photo window resolution for active areas below 0.25 microns, a silicon oxynitride anti-reflective coating can be formed on a silicon nitride layer. However, the silicon oxynitride will induce a water spot defect following a B-cleaning process (e.g. SPM+DHF+SC-1+SC-2). If the water spot defect occurs on the shallow trench isolation area, it will cause a void in the oxide reducing the yield.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,786,263 (Perera) shows a STI trench etch and fill process.

U.S. Pat. No. 5,721,174 (Peidous) discloses a SiN barrier layer and trench etch process.

U.S. Pat. No. 5,679,599 (Mehta) and U.S. Pat. No. 5,459,096 (Venkatesane et al.) show STI trench etch and barrier layer processes.

SUMMARY OF THE INVENTION

It is an object of the present invention to provide a method for forming a shallow trench isolation for a device having an active area below 0.25 using a silicon oxynitride anti-reflective coating with improved yield.

It is another object of the present invention to provide a method for forming a shallow trench isolation with a silicon oxynitride anti-reflective coating which is free from water spot defects.

It is yet another object of the present invention to provide an economical method for forming a shallow trench isolation with a silicon oxynitride anti-reflective coating which has an improved yield.

To accomplish the above objectives, the present invention provides a method for forming a shallow trench isolation using a SiON anti-reflective coating which eliminates water spot defects. The method begins by providing a substrate. A pad oxide layer is formed over the substrate. A silicon nitride layer is formed on the pad oxide layer. A silicon oxynitride layer is formed on the silicon nitride layer. A photoresist mask, having an opening, is formed over the silicon oxynitride layer. The silicon oxynitride layer, the silicon nitride layer, the pad oxide layer, and the substrate are etched through the opening, forming a trench. The photoresist mask is removed. In the key step, the silicon oxynitride layer is removed using a buffered oxide etch. A thin lining oxide layer is grown. Then, a silicon oxide layer is deposited and planarized to form a shallow trench isolation.

The present invention provides considerable improvement over the prior art. The key advantage is that the process yield is improved by eliminating water spot defects.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a shallow trench isolation using a SiON anti-reflective coating which eliminates water spot defects.

Figure 1:
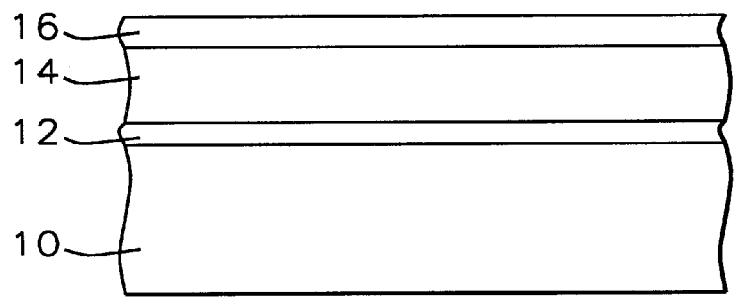
FIGS. 1, 2 & 3 illustrate sequential sectional views of a process for forming a shallow trench isolation using a SiON anti-reflective layer, known by the inventors to have a problem.
Figure 2:
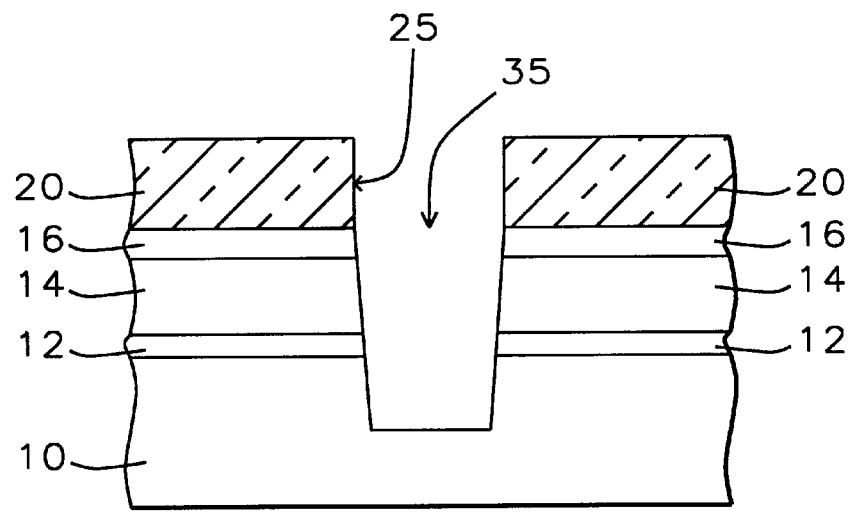
Figure 3:
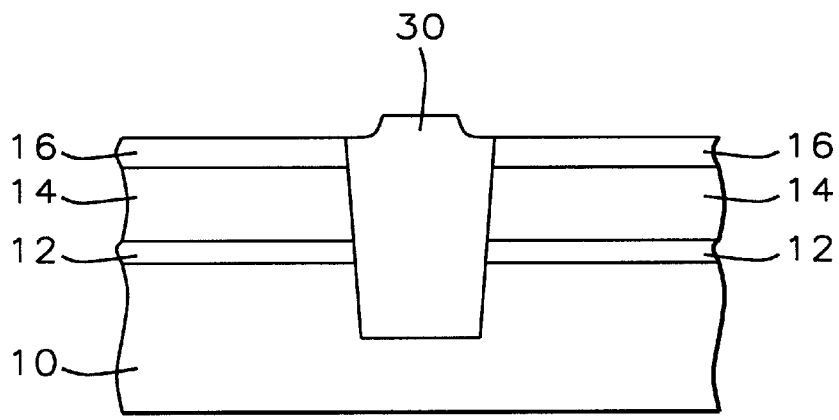

Problem Identified by the Inventors-FIGS. 1, 2 & 3

The inventors have found that a process known to the inventors has a problem. Although a SiON anti-reflective coating improves the critical dimension during photolithography it induces a water spot following B-cleaning. These water spots can collapse leaving a void. If the water spot occurs in the trench for the shallow trench isolation it can result in a short between a polysilicon layer deposited over the shallow trench isolation and the substrate.

The B-cleaning process comprises 4 wet clean tanks, wherein: the first tank contains SPM ($H_2SO_4+H_2O_2$) for removing organic residue; the second tank contains diluted HF for removing surface oxide; the third tank contains SC-1 ($NH_4OH+H_2O_2+H_2O$) for removing organics and particles; and the fourth tank contains SC-2 ($HCl+H_2O_2+H_2O$) for removing metallic residue. The inventors have determined that silicon oxynitride reacts with the SC-1 solution to cause water spots.

Referring to FIG. 1, a process known by the inventors to have a water spot problem, begins by providing a substrate (10) such as a monocrystalline silicon wafer. A pad oxide layer (12) is formed over the substrate (10). A silicon nitride layer (14) is formed on the pad oxide layer (12). The silicon nitride layer preferably has a thickness of between about 1575 Angstroms and 1675 Angstroms and more preferably about 1625 Angstroms.

Still referring to FIG. 1, a silicon oxynitride layer (16) is preferably formed on the silicon nitride layer (14) to act as an anti-reflective layer. The silicon oxynitride layer reduces reflected light during the photolithigraphy process, thereby reducing distortion of the photoresist mask and helping to maintain the critical dimension defined by the width of the photoresist mask pattern. The silicon oxynitride layer (16) preferably has a thickness of between about 350 Angstroms and 450 Angstroms, and more preferably about 400 Angstroms. Alternatively, an organic bottom anti-reflective coating (BARC) can be used in place of the silicon oxynitride layer (16).

Referring to FIG. 2, a photoresist mask (20) is formed over the silicon oxynitride layer (16). The photoresist mask has an opening (25). The opening (25) preferably has a width of between about 0.2 microns and 0.5 microns. The silicon oxynitride layer (16), the silicon nitride layer (14), the pad oxide layer (12) and the substrate (10) are etched through the opening (25) in the photoresist mask (20) forming a trench (35). The etch can be performed using a reactive ion etch process, a plasma etch process, or most preferably a magnetic enhance reactive ion etch (MERIE) process.

Referring to FIG. 3, the photoresist mask (20) is removed using a process known in the art, such as ashing in $O_2$ and wet cleaning in SPM. A lining oxide layer is grown. The wafer is cleaned using a B-clean process. Then, a silicon oxide layer (30) is deposited in the trench (35). The silicon oxide layer (30) has a sufficient thickness so that, over the trench (35), its top surface is above the level of the top surface of the adjacent silicon oxynitride layer (16). The silicon oxide layer (30) is etched back to form a shallow trench isolation.

The B-cleaning process is a 4 tank process. The first tank contains $H_2SO_4$ with a concentration of about 98% and $H_2O_2$ at a ratio of about $4(H_2SO_4):1(H_2O_2)$, and at a temperature of about 130° C. The second tank contains HF with a concentration of about 49% and $H_2O$ at a ratio of about $1(HF):100H_2O)$, and at a temperature of about 25° C. The third tank contains SC-1 (e.g. $NH_4OH$ with a concentration of about 130%, $H_2O_2$, and $H_2O$ at a ratio of about $0.4(NH_4OH):1(H_2O_2):5(H_2O)$ and at a temperature of about 70° C. The fourth tank contains SC-2 (e.g. HCl, $H_2O_2$, and $H_2O$ at a ratio of about $1(HCl):1(H_2O_2):5(H_2O)$, and at a temperature of about 60° C.

The problem that the inventors have discovered with this process is that the oxynitride layer is necessary for the photolithography process, but it causes the water spot defect described above.

Figure 4:
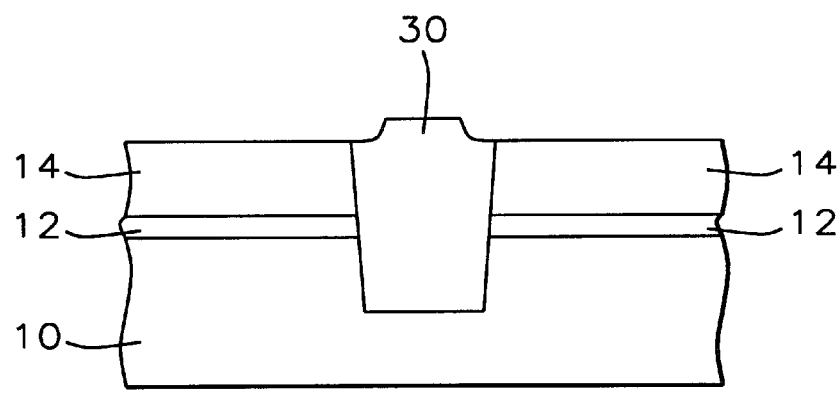
FIG. 4 illustrates a method for forming a shallow trench isolation using a SiON anti-reflective layer according to the invention.

Preferred Embodiment of the Present Invention-
FIGS. 1, 2 & 4

In the preferred embodiment of the present invention, the silicon nitride layer, silicon oxide layer, photoresist mask, and trench are made in the same manner as the process described above. However, after the photresist mask is removed and before the B-cleaning process is performed and the silicon oxide layer is formed, the silicon oxynitride layer is removed using a buffered oxide etch.

Referring again to FIG. 1, the preferred embodiment of the present invention begins by providing a substrate (10) such as a monocrystalline silicon wafer. A pad oxide layer (12) is formed on the substrate (10). A silicon nitride layer (14) is formed over the substrate (10). The silicon nitride layer preferably has a thickness of between about 1575 Angstroms and 1675 Angstroms and more preferably about 1625 Angstroms.

Still referring to FIG. 1, a silicon oxynitride layer (16) is formed on the silicon nitride layer (14) to act as an anti-reflective layer. The silicon oxynitride layer reduces reflected light during the photolithigraphy process, thereby reducing distortion of the photoresist mask and helping to maintain the critical dimension defined by the width of the photoresist mask pattern. The silicon oxynitride layer (16) preferably has a thickness of between about 350 Angstroms and 450 Angstroms, and more preferably about 400 Angstroms.

Referring to FIG. 2, a photoresist mask (20) is formed over the silicon oxynitride layer (16). The photoresist mask has an opening (25). The opening (25) preferably has a width of between about 0.2 microns and 0.5 microns. The silicon oxynitride layer (16), the silicon nitride layer (14), the pad oxide layer (12) and the substrate (10) are etched through the opening (25) in the photoresist mask (20) forming a trench (35). The etch can be performed using a reactive ion etch process, a plasma etch process, or most preferably a MERIE process.

Referring to FIG. 4, the photoresist mask (20) is removed using a process known in the art, such as ashing in $O_2$ and wet clean in SPM. In the key step, the oxynitride layer (16) is removed using a buffered oxide etch. The buffered oxide etch can be performed in a $NH_4F$ and HF solution having a concentration of between about 5% and 15% at a temperature of between about 20° C. and 30° C. for a time of between about 60 seconds and 180 seconds.

The wafer is then cleaned using a B-clean process as described above. Since water spots are caused by the reaction of the oxynitride layer and the SC-1 solution in the B-clean process, removing the oxynitirde layer prior to performing the B-clean process prevents the water spot problem.

Still referring to FIG. 4, a silicon oxide layer (30) is deposited in the trench (35). The silicon oxide layer (30) has a sufficient thickness so that, over the trench (35), its top surface is above the level of the top surface of the adjacent silicon oxynitride layer (16), preferably between about 5000 Angstroms and 7000 Angstroms. The silicon oxide layer (30) is planarized using a chemical-mechanical polishing process to form a shallow trench isolation.

Experimental Results

Referring to Table 1, wafers were prepared with the SiON layer left on during silicon oxide layer deposition and with the SiON layer removed prior to the silicon oxide layer deposition according to the present invention. As shown in Table 1, the wafer with the SiON left on according to the problem process had a significantly higher defect rate than the wafer which had the SiON layer removed according to the invention. Over half of the defects reviewed were from water spots.

TABLE 1

|  | problem process (SiON) | invention (without SiON) |
|---|---|---|
| total defects | 802 | 397 |
| particle | 107 | 397 |
| water spot | 157 | 0 |
| not reviewed | 538 | 0 |

While the invention has been particularly shown and described with reference to the preferred embodiments thereof, it will be understood by those skilled in the art that various changes in form and details may be made without departing from the spirit and scope of the invention.

What is claimed is:

1. A method for forming a shallow trench isolation using a SiON anti-reflective coating which eliminates water spot defects, comprising the steps of:

a. forming a pad oxide layer over a substrate;
b. forming a silicon nitride layer on said pad oxide layer;
c. forming a silicon oxynitride layer on said silicon nitride layer;
d. forming a photoresist mask over said silicon oxynitride layer; said photoresist mask having an opening;
e. etching a trench in said silicon oxynitride layer, said silicon nitride layer, said pad oxide layer and said substrate through said opening in said photoresist mask;
f. removing said photoresist mask;
g. removing said silicon oxynitride layer;
h. cleaning said substrate with a solution comprising $NH_4OH$, $H_2O$, $H_2O_2$, wherein water spots are prevented by the absence of silicon oxynitirde;
i. growing a thin silicon oxide layer and depositing a silicon oxide layer in said trench; and
j. planarizing said silicon oxide layer to form a shallow trench isolation.

2. The method of claim 1 wherein said silicon nitride layer has a thickness of between about 1475 Angstroms and 1575 Angstroms and said silicon oxynitride layer has a thickness of between about 350 Angstroms and 450 Angstroms.

3. The method of claim 1 wherein said silicon oxide layer has a thickness of between about 5000 Angstroms and 7000 Angstroms.

4. The method of claim 1 wherein said opening in said photoresist mask has a width of between about 0.2 micons and 0.5 microns.

5. The method of claim 1 which further includes forming a conductive layer over said shallow trench isolation.

6. The method of claim 1 wherein said oxynitride layer is removed using a buffered oxide etch.

7. A method for forming a shallow trench isolation using a SiON anti-reflective coating which eliminates water spot defects, comprising the steps of:
  a. forming a pad oxide layer over a substrate;
  b. forming a silicon nitride layer on said pad oxide layer;
  c. forming a silicon oxynitride layer on said silicon nitride layer;
  d. forming a photoresist mask over said silicon oxynitride layer; said photoresist mask having an opening with a width of between about 0.2 microns and 0.5 microns;
  e. etching said silicon oxynitride layer, said silicon nitride layer, said pad oxide layer and said substrate through said opening in said photoresist mask; thereby forming a trench;
  g. removing said photoresist mask;
  h. removing said silicon oxynitride layer using a buffered oxide etch;
  i. cleaning said substrate with a solution comprising $NH_4OH$, $H_2O$, and $H_2O_2$, wherein water spots are prevented by the absence of silicon oxynitirde;
  j. growing a thin silicon oxide layer and depositing a silicon oxide layer in said trench; and
  k. etching said silicon oxide layer to form a shallow trench isolation.

8. The method of claim 7 wherein said silicon nitride layer has a thickness of between about 1475 Angstroms and 1575 Angstroms and said silicon oxynitride layer has a thickness of between about 350 Angstroms and 450 Angstroms.

9. The method of claim 7 wherein said silicon oxide layer has a thickness of between about 5000 Angstroms and 7000 Angstroms.

10. The method of claim 8 wherein said silicon oxide layer has a thickness of between about 5000 Angstroms and 7000 Angstroms.

11. The method of claim 7 which further includes forming a conductive layer over said shallow trench isolation.

12. The method of claim 10 which further includes forming a conductive layer over said shallow trench isolation.

13. The method of claim 7 wherein said silicon oxynitride layer is removed using a buffered oxide etch comprising $NH_4F$ and HF at a concentration of between about 5% and 15% at a temperature of between about 20° C. and 30° C. for a time of between about 60 seconds and 180 seconds.

14. The method of claim 10 wherein said silicon oxynitride layer is removed using a buffered oxide etch comprising $NH_4F$ and HF at a concentration of between about 5% and 15% at a temperature of between about 20° C. and 30° C. for a time of between about 60 seconds and 180 seconds.

* * * * *